United States Patent
Nikutta et al.

[11] Patent Number: 6,107,815
[45] Date of Patent: Aug. 22, 2000

[54] TEST CIRCUIT AND TESTING METHOD FOR FUNCTION TESTING OF ELECTRONIC CIRCUITS

[75] Inventors: Wolfgang Nikutta, München; Hartmut Schmökel, Ottobrunn; Günther Kuchinke, Neubiberg; Thomas von der Ropp, Germering, all of Germany; Rudolph Walter, Shelburne, Vt.

[73] Assignee: Infineon Technologies AG, Munich, Germany

[21] Appl. No.: 08/605,901

[22] Filed: Feb. 23, 1996

[30] Foreign Application Priority Data

Feb. 23, 1995 [DE] Germany ............... 195 06 325

[51] Int. Cl.[7] .................................................. G01R 31/28
[52] U.S. Cl. .................................... 324/765; 365/201
[58] Field of Search .......................... 324/158.1, 765, 324/126, 128, 754, 760; 365/201; 371/21.1, 21.2, 21.6; 714/718, 719, 720, 721

[56] References Cited

U.S. PATENT DOCUMENTS

| | | | |
|---|---|---|---|
| 3,909,672 | 9/1975 | Lundquist et al. | 324/126 |
| 4,414,665 | 11/1983 | Kimura et al. | 714/719 |
| 4,943,765 | 7/1990 | Dupraz et al. | 324/126 |
| 4,968,931 | 11/1990 | Littlebury et al. | 324/760 |
| 5,070,297 | 12/1991 | Kwon et al. | 324/754 |
| 5,142,449 | 8/1992 | Littlebury | 439/66 |
| 5,177,439 | 1/1993 | Liu et al. | 324/754 |

FOREIGN PATENT DOCUMENTS

| | | |
|---|---|---|
| 32 29 749 A1 | 2/1984 | Germany . |
| 35 16 755 A1 | 11/1985 | Germany . |
| 35 28 189 C2 | 2/1986 | Germany . |
| 37 28 521 A1 | 3/1989 | Germany . |
| 38 00 544 A1 | 7/1989 | Germany . |

*Primary Examiner*—Ernest Karlsen
*Attorney, Agent, or Firm*—Herbert L. Lerner; Laurence A. Greenberg; Werner H. Stemer

[57] ABSTRACT

An apparatus for function testing of electronic circuits includes a tester array having a terminal. A test circuit has at least two resistor elements, a common circuit node connected to the resistor elements for connection to the terminal of the tester array, and terminals of the resistor elements each being remote from the circuit node for connection to a respective output of an electronic circuit to be tested. A testing method for function testing of electronic circuits with such an apparatus includes placing the electronic circuit into a state in which signals are present at an output of the electronic circuit to be tested. The electronic circuit is function tested with respect to a resultant signal being established at the common circuit node.

14 Claims, 2 Drawing Sheets

TEST CIRCUIT AND TESTING METHOD FOR FUNCTION TESTING OF ELECTRONIC CIRCUITS

BACKGROUND OF THE INVENTION

Field of the Invention

The invention relates to a test circuit and a testing method for function testing of electronic circuits that have outputs.

Testing of electronic circuits for freedom from defects is a task that arises frequently. Such tests are often performed, especially following the process of manufacturing the circuits. In such cases it is desirable to limit the testing to placing the electronic circuit into a defined state and then merely observing the signals at its outputs and comparing them with limit or command values to be met if the circuit is functioning properly. Depending on the type of electronic circuit, a more or less certain statement can then be made as to the satisfactory function of the entire circuit.

Integrated memory components, such as RAMs, are, for instance, subjected to such function testing at the manufacturer. Each output of the memory components to be tested is connected to one terminal of a tester array that carries out the testing. Next, the tester array writes on the memory cells of the memory component and reads them out again. In that way, malfunctions of the tested circuit can be found.

When electronic circuits are tested according to the prior art described, a limitation in testing capacity exists for a given number of terminals in the tester array:

A circuit can be tested completely, or a plurality of circuits can be tested simultaneously with a tester array only if the total number of outputs to be tested does not exceed the number of corresponding terminals of the tester array. Increasing the testing capacity can be done only by using a tester array having a larger number of corresponding terminals, or by using additional tester arrays.

SUMMARY OF THE INVENTION

It is accordingly an object of the invention to provide a test circuit and a testing method for function testing of electronic circuits, which overcome the hereinaforementioned disadvantages of the heretofore-known devices and methods of this general type and in which a testing capacity is increased, and thus a maximum throughput of circuits to be tested is raised for a given number of terminals of a tester array.

With the foregoing and other objects in view there is provided, in accordance with the invention, an apparatus for function testing of electronic circuits, comprising a tester array having a terminal; and a test circuit having at least two resistor elements, a common circuit node connected to the resistor elements for connection to the terminal of the tester array, and terminals of the resistor elements each being remote from the circuit node for connection to a respective output of an electronic circuit to be tested.

Since outputs of one or more electronic circuits can be connected through resistor elements to a common circuit node, which in turn can be connected to one terminal of a tester array, a larger number of outputs can be tested simultaneously with the same tester array. For instance, if two outputs of the circuits to be tested are always connected to the tester array through resistor elements, a doubling of the testing capacity is already achieved, so that a doubling of the testing throughput is possible. In this way, investment cost for tester arrays can be reduced.

In accordance with another feature of the invention, the terminals connected through the resistor elements to the common circuit node have the same signal during testing, in the event that the electronic circuit to be tested is functioning properly.

In accordance with a further feature of the invention, the test circuit is a component of the electronic circuit.

In accordance with an added feature of the invention, the test circuit is a component of the tester array.

In accordance with an additional feature of the invention, there is provided a plug-in board on which the test circuit is disposed.

In accordance with yet another feature of the invention, the resistor elements are active resistors.

In accordance with yet a further feature of the invention, the resistor elements are active resistors (for instance, transistor elements connected as resistors, such as transistors or thyristors) or passive resistors (such as ohmic resistors).

In accordance with yet an added feature of the invention, the resistor elements connected to the common circuit node have the same resistance value.

In accordance with yet an additional feature of the invention, the resistor elements connected to the common circuit node have different resistance values.

In accordance with again another feature of the invention, the resistor elements are short-circuit elements.

If the output signals to be expected at the outputs of the circuits to be tested are known in terms of their limit values (potential, current intensity, signal shape) for the test situation at the moment of evaluation, then a relative limit value with respect to the aforementioned limit values for the resultant signal established at the common circuit node (and therefore at the corresponding terminal of the tester array) can be specified at the moment of evaluation by suitable dimensioning of the resistor elements.

In accordance with again a further feature of the invention, the specification of this relative limit value can also be carried out by adding further resistor elements between the circuit node, connected to the tester array, and a fixed potential such as ground. If the relative limit value is exceeded or fails to be attained, then the tester array ascertains a defect of the tested circuit.

As mentioned above, it is especially advantageous if conventional tester arrays are used and the test circuit is inserted between the electronic circuit to be tested and the tester array, for example in a connecting cable between the memory element and the tester array, or on a test stand or plug-in board of the kind already used previously for testing. This makes for the least expense, and a later modification of the test circuit can be carried out especially easily. On the other hand, through the use of slight structural changes in the tester array or in the circuit to be tested, a configuration of resistor elements is possible there as well.

The invention is suitable for testing both analog and digital circuits. It is especially suitable for testing identical-type outputs and for testing integrated circuits that have regions with random access memories (SRAM, DRAM, FRAM) or nonvolatile memories (EPROM). The outputs of the circuits to be tested can also be bidirectional (input/output terminals).

If resistor elements with a common circuit node that have identical resistance values are used, then for identical-type outputs the same test resolution (accuracy of the testing) is attainable as when individual outputs are tested without the test circuit of the invention.

In determining the resistance values for the resistor elements to be used, the maximum allowable currents per output of the circuit to be tested should be taken into account. It is possible that for test purposes other resistance or capacitive loads can be connected to the outputs along with the test circuit, in a known manner. In the calculation of the maximum possible current, not only the currents through the resistor elements but the currents through those additional loads must then also be taken into account.

As mentioned above, if DRAMs with identical outputs are tested with the test circuit, then when two outputs at a time are tested jointly, the use of ohmic resistor elements with a resistance of 68 ohms each, for instance, have proved to be appropriate.

It is possible for at least one of the resistor elements with a common circuit node, but not all of them, to be a short-circuit element with an ohmic resistance of 0 Ω.

The test circuit makes it possible to connect outputs of a plurality of electronic circuits to a common circuit node through resistor elements, so that these circuits can be connected to one common terminal of the tester array. The electronic circuits to be tested may each have only one output.

Other features which are considered as characteristic for the invention are set forth in the appended claims.

Although the invention is illustrated and described herein as embodied in a test circuit and a testing method for function testing of electronic circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
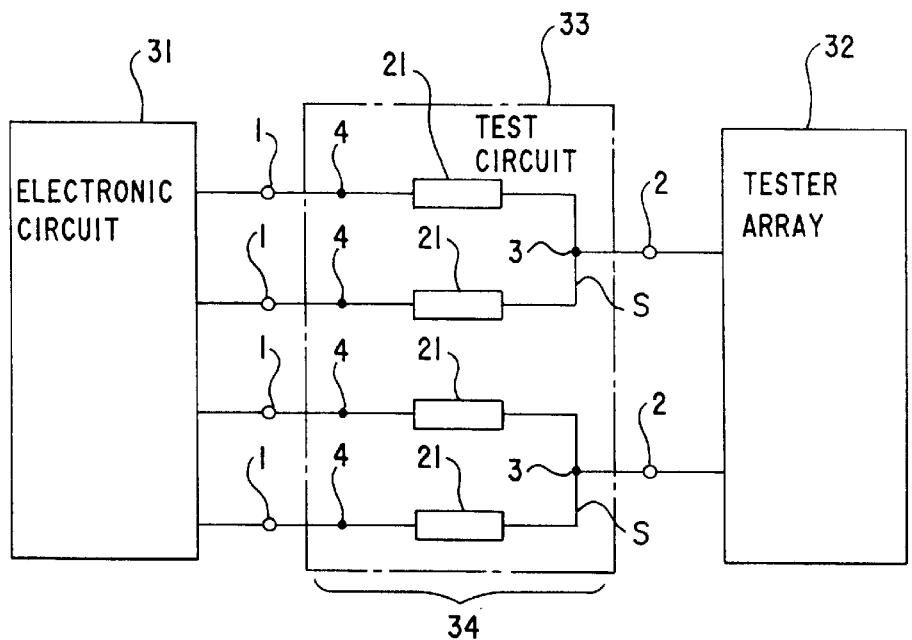
FIGS. 1–3 are block circuit diagrams of various embodiments of the invention.

Referring now in detail to the figures of the drawing, which are purely schematic and are limited to the features that are absolutely necessary to the invention, and first, particularly, to FIG. 1 thereof, there is seen a test circuit 33, which may be located on a test stand 34, a plug-in board, or the like. The test circuit 33 has four resistor elements 21, each two of which can be connected to one another through one respective circuit node 3. In order to carry out a function test, the circuit nodes 3 can be connected to terminals 2 of a tester array 32. Terminals 4 of the resistor elements 21, which are remote from the circuit nodes 3, can be connected to outputs 1 of an electronic circuit 31 to be tested. The outputs 1 may at the same time also be inputs of the circuit 31. In the exemplary embodiment shown in FIG. 1, connections between the test circuit 33 and both the circuit 31 and the tester array 32 are shown. The function testing is carried out with respect to a resultant signal S that is established at the circuit nodes 3.

The use of ohmic resistors as resistor elements 21 is advantageous. However, the use of transistors wired as resistors is also possible as an example.

Figure 4:
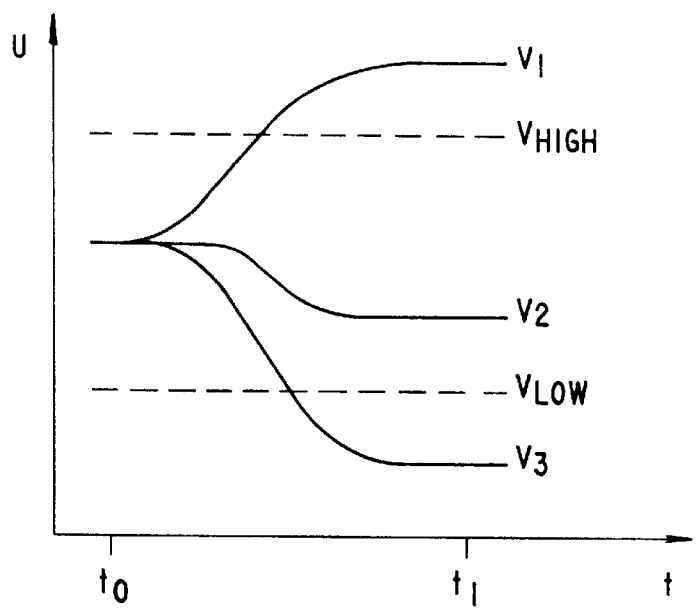
FIG. 4 is a diagram showing possible signal courses at a common circuit node.

It is advantageous for the resistor elements 21 that have a common circuit node 3 to have the same resistance value, especially if the outputs 1 that are connected to a common circuit node 3 through the resistor elements 21 have output signals with substantially the same potential at an evaluation time $t_1$ seen in FIG. 4, when the circuit 31 is functioning properly. Then, if the circuit 31 is intact, a resultant signal S with the same potential is established at the circuit node 3 as well, and thus also at the terminal 2 of the tester array 32.

Figure 2:
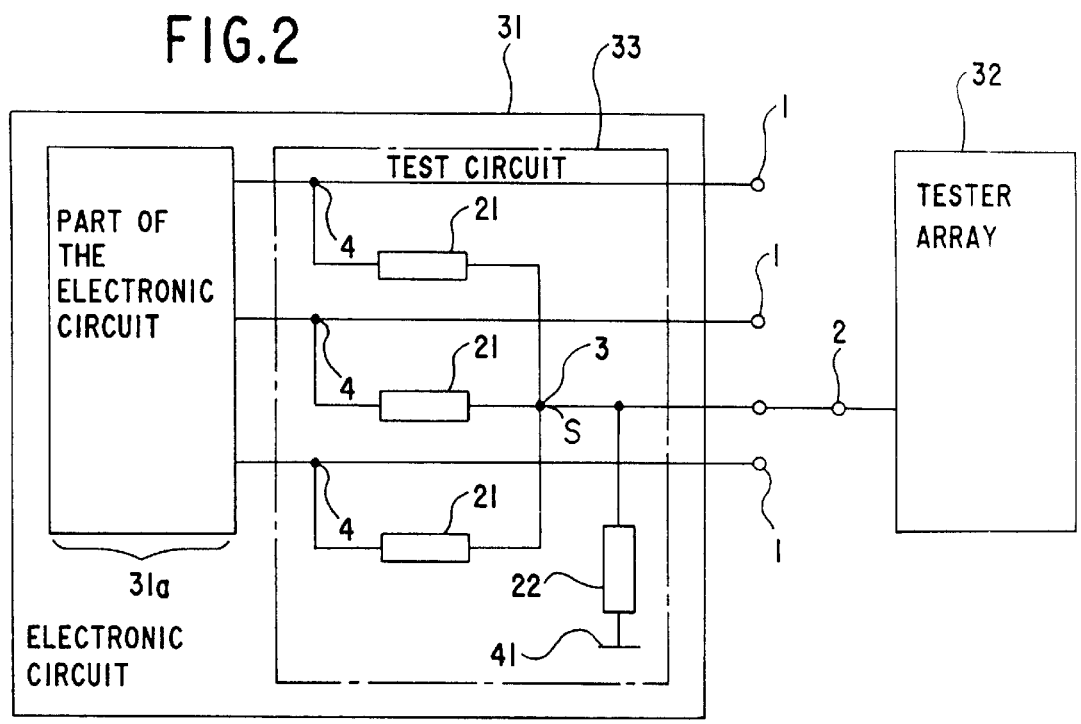

In FIG. 2, the test circuit 33 is a component of the electronic circuit 31 to be tested. The latter circuit may be constructed with integrated circuitry. The part of the circuit 31 to be tested is indicated by reference numeral 31a. The test circuit 33 has three resistor elements 21, which have one common circuit node 3. The terminals 4 of the resistor elements 21 are each electrically connected to one respective output of the electronic circuit 31 to be tested. The circuit node 3 can be connected to a terminal 2 of the tester array 32. This connection is shown for the exemplary embodiment of FIG. 2. The test circuit 33 in FIG. 2 also has one further resistor element 22, which is disposed between the circuit node 3 and a fixed potential 41, in this case ground. The further resistor element 22 and the resistor elements 21 together form voltage dividers. By suitable dimensioning of the resistor elements 21 and of the further resistor element 22, it is possible to specify a relative limit value, with respect to the limit value of the output signals at the outputs 1, for the resultant signal S at the evaluation time $t_1$ that is established at the common circuit node 3 (and thus at the corresponding terminal 2 of the tester array 32), even if the limit values for the output signals of individual outputs 1 deviate from one another.

Figure 3:
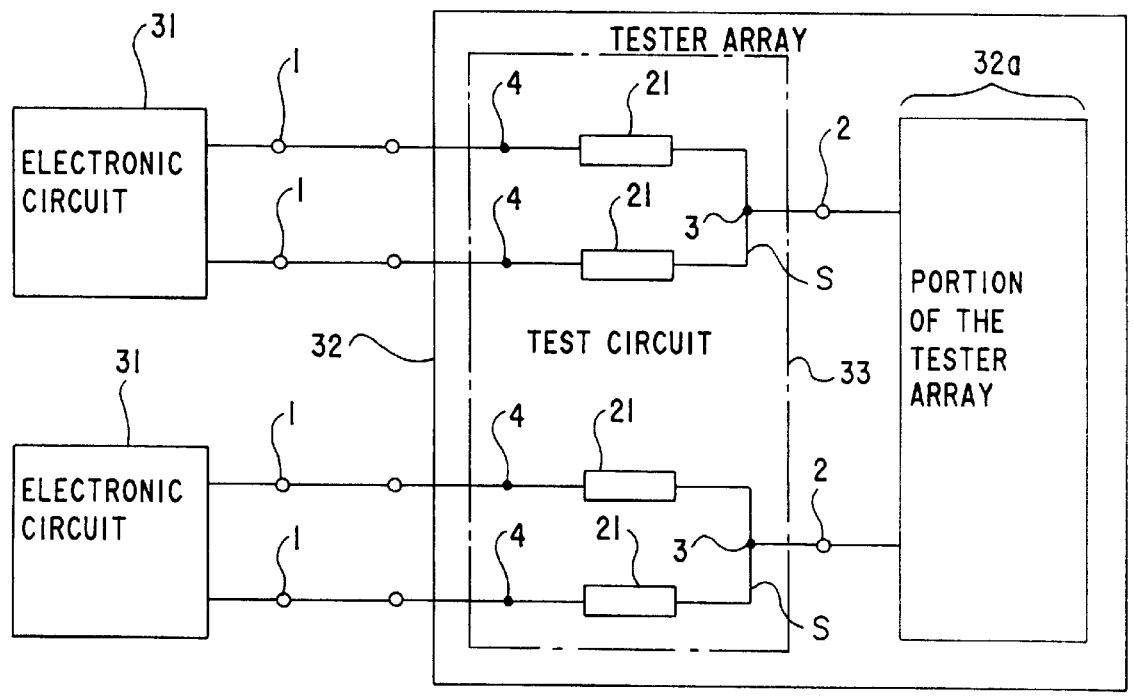

FIG. 3 shows an exemplary embodiment of the invention for the simultaneous testing of two electronic circuits 31 through the use of one tester array 32. The test circuit 33 in this exemplary embodiment is a component of the tester array 32. The portion of the tester array 32 that differs from the test circuit 33 is indicated by reference numeral 32a. Each of two outputs 1 of each electronic circuit 31 is connected to one terminal 4 of a respective resistor element 21. This connection has been made in the exemplary embodiment of FIG. 3. The resistor elements 21 that are connected to the same circuit 31 have a common circuit node 3. The circuit nodes 3 can each be connected to one terminal 2 of the tester array 32.

FIG. 4 is a diagrammatic illustration of possible courses of the resultant signal S that can occur when the testing is carried out at one of the circuit nodes 3 and thus at the terminal 2 of a tester array 32 to be connected to it. FIG. 4 shows a potential course U over time t. In the case of the basic exemplary embodiment, it is assumed that the circuit 31 to be tested is an integrated memory component, such as a DRAM, having an output 1 at which, given proper function, signals are present at the evaluation time $t_1$ that have a potential corresponding to the logical 1 state. It is also assumed that two outputs 1 of the memory component 31, as in the exemplary embodiment of FIG. 1, are connected through resistor elements 21 to a common circuit node 3, which is connected to one of the terminals 2 of the tester array 32. Furthermore, it is assumed that the resistor elements 21 have the same resistance value. In those cases in which the same signal is present at the outputs 1, the same signal is likewise established at the circuit node 3, without any current flowing between the outputs 1 through the resistor elements 21.

In FIG. 4, reference symbol $V_{HIGH}$ represents a lower threshold of the potential range in which a signal at the evaluation time $t_1$ is recognized as a logical 1 by the tester array 32. Reference symbol $V_{LOW}$ represents an upper threshold of the range with which the logical 0 value is associated. At a time $t_0$, the outputs 1 are in the high-impedance state (tristate). If they are activated, the signals at the outputs 1 rise up to the time $t_1$. The time $t_1$ is the earliest possible evaluation time at which the resultant signals S that are present at the terminals 2 connected to the circuit nodes 3 can be evaluated by the tester array 32.

When previously written addressed memory cells are read out, signals with potentials that are greater than $V_{HIGH}$ appear at the outputs 1 at the evaluation time $t_1$ if the memory component 31 is intact. The consequence of these signals, at the circuit node 3 connected to these outputs 1 through resistor elements 21 and thus at the terminal 2, is resultant signals S with a potential $V_1$, which is likewise greater than $V_{HIGH}$.

Conversely, if one or both signals present at the outputs 1 with a common circuit node 3 are defective at the evaluation time $t_1$, then their potentials are less than $V_{HIGH}$. The consequence of these signals at the terminal 2 is a resultant signal S with a potential $V_2$, which is likewise below $V_{HIGH}$.

If the memory component 31 is examined with respect to the reading of logical 0 values, then the testing has the equivalent result of a proper function of the memory component 31 if a signal that is less than $V_{LOW}$ is found at the circuit node 3.

In this way, by testing the resultant signal S at the circuit node 3 or at the terminal 2, the proper function of the memory component 31 can be tested.

We claim:

1. An apparatus for function testing of integrated memory circuits, comprising:

a tester array having a terminal for testing integrated memory circuits; and a test circuit having at least two resistor elements, a common circuit node between said resistor elements connected to said terminal of said tester array, and terminals of said resistor elements each being remote from said circuit node for connection to a respective output of an integrated memory circuit to be tested.

2. The testing apparatus according to claim 1, wherein said terminals connected through said resistor elements to said common circuit node have the same signal during testing, in the event that the integrated memory circuit to be tested is functioning properly.

3. The testing apparatus according to claim 1, wherein said test circuit is a component of the electronic circuit.

4. The testing apparatus according to claim 1, wherein said test circuit is a component of said tester array for testing the integrated memory circuits.

5. The testing apparatus according to claim 1, including a plug-in board on which said test circuit is disposed.

6. The testing apparatus according to claim 1, wherein said resistor elements are active resistors.

7. The testing apparatus according to claim 1, wherein said resistor elements are transistor elements.

8. The testing apparatus according to claim 1, wherein said resistor elements are passive resistors.

9. The testing apparatus according to claim 1, wherein said resistor elements are ohmic resistors.

10. The testing apparatus according to claim 9, wherein said ohmic resistors have a resistance of 68 Ω.

11. The testing apparatus according to claim 1, wherein said resistor elements connected to said common circuit node have the same resistance value.

12. The testing apparatus according to claim 1, wherein said resistor elements connected to said common circuit node have different resistance values.

13. The testing apparatus according to claim 1, wherein said resistor elements are short-circuit elements.

14. The testing apparatus according to claim 1, including a further resistor element connected between said circuit node and a fixed potential.

* * * * *